United States Patent
Lien et al.

(10) Patent No.: US 6,232,647 B1
(45) Date of Patent: May 15, 2001

(54) AIR GAP WITH BORDERLESS CONTACT

(75) Inventors: Chuen-Der Lien, Los Altos Hills; Shih-Ked Lee; Chu-Tsao Yen, both of Fremont, all of CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/434,544

(22) Filed: Nov. 5, 1999

Related U.S. Application Data

(62) Division of application No. 09/019,491, filed on Feb. 5, 1998, now Pat. No. 6,025,260.

(51) Int. Cl.$^7$ ............................................. H01L 29/00
(52) U.S. Cl. ..................... 257/522; 257/412; 257/634; 257/758
(58) Field of Search ................................. 257/522, 412, 257/634, 758

(56) References Cited

U.S. PATENT DOCUMENTS

| | | |
|---|---|---|
| 3,890,636 | 6/1975 | Harada et al. . |
| 4,502,210 | 3/1985 | Okumura et al. . |
| 4,801,560 | 1/1989 | Wood et al. . |
| 4,830,971 | 5/1989 | Shibata . |
| 4,933,743 | 6/1990 | Thomas et al. . |
| 4,986,878 | 1/1991 | Malazgirt et al. . |
| 5,119,164 | 6/1992 | Sliwa, Jr. et al. . |
| 5,155,576 | 10/1992 | Mizushima . |
| 5,192,715 | 3/1993 | Sliwa, Jr. et al. . |
| 5,200,357 | 4/1993 | Collot et al. . |
| 5,278,103 | 1/1994 | Mallon et al. . |
| 5,283,203 | 2/1994 | Gill et al. . |
| 5,310,700 | 5/1994 | Lien et al. . |
| 5,324,682 | 6/1994 | Tserng . |
| 5,338,702 | 8/1994 | Kobeda et al. . |
| 5,385,852 | 1/1995 | Oppermann et al. . |
| 5,407,860 | 4/1995 | Stoltz et al. . |
| 5,432,115 | 7/1995 | Rosner et al. . |
| 5,461,003 | 10/1995 | Havemann et al. . |
| 5,536,679 | 7/1996 | Park . |

FOREIGN PATENT DOCUMENTS

| | | |
|---|---|---|
| 1-189939 | 7/1989 | (JP) . |
| 1-318248 | 12/1989 | (JP) . |

OTHER PUBLICATIONS

Gallagher et al., "A Novel, Borderless Metal–to–Diffusion Contact Technique," 1995 IEEE/SEMI Advanced Semiconductor Manufacturing Conference, p. 13–15.

Cleeves et al., "A Novel Disposable Post Technology For Self–Aligned Sub–Micron Contacts," 1994 Symposium on VLSI Technology Digest of Technical Papers (IEEE), p. 61–62.

*Primary Examiner*—John F. Niebling
*Assistant Examiner*—David A. Zarneke
(74) *Attorney, Agent, or Firm*—Bever, Hoffman & Harms, LLP

(57) ABSTRACT

A semiconductor structure having a first conductive trace fabricated adjacent to a second conductive trace over an insulating layer. A dielectric material is located over and between the first and second conductive traces. A borderless contact extends through the dielectric material to contact the first conductive trace. An air gap is formed in the dielectric material between the first and second conductive traces, thereby increasing the capacitance between the first and second traces. The air gap has a first portion with a first width adjacent to the borderless contact, and a second portion with a second width away from the borderless contact. The second width is greater than the first width, and the second portion of the air gap is substantially longer than the first portion of the air gap. The first portion of the air gap is offset toward the second trace. The second portion of the air gap maximizes the capacitance between the first and second traces, while the first portion of the air gap minimizes the contacted pitch of the first and second traces.

10 Claims, 12 Drawing Sheets

AIR GAP WITH BORDERLESS CONTACT

This application is a divisional of U.S. Ser. No. 09/019,491 filed on Feb. 5, 1998, now U.S. Pat. No. 6,025,260.

BACKGROUND OF THE INVENTION

1. Field of the Invention

The present invention relates to the formation of electrically conductive traces in a semiconductor process. More specifically, the present invention relates to the formation an electrically insulating air gap between traces which implement borderless contacts.

2. Discussion of Related Art

FIG. 1 is a cross-sectional view of a semiconductor structure 100 which includes electrically conductive traces 101 and 102 formed over an insulating layer 103 and a semiconductor substrate 104. A dielectric material 105 is formed over traces 101 and 102, thereby isolating these traces. An air gap 106 is located in the dielectric material 105, between traces 101 and 102. The dielectric constant of the air gap 106 is significantly less than the dielectric constant of the dielectric material 105. As a result, the air gap 106 reduces the capacitance between traces 101 and 102. This reduced capacitance improves the speed of signal transmission on traces 101 and 102.

FIG. 2A is a top view of a semiconductor structure 200 which includes a borderless contact. FIG. 2B is a cross sectional view of semiconductor structure 200 along section line 2B—2B of FIG. 2A. Semiconductor structure 200 includes a first electrically conductive trace 201 formed over an insulating layer 202 and a semiconductor substrate 203. A dielectric material 204 is formed over first trace 201. A via 205 extends through dielectric material 204 to expose a portion of trace 201. Via 205 need not be precisely aligned with trace 201. Rather, an offset 206 may exist with respect to the first trace 201 and via 205. The allowable offset 206 is determined by the accuracy of the processing parameters. A second electrically conductive trace 207 is deposited over the dielectric material 204 and into via 205, such that the second trace 207 makes an electrical connection with the first trace 201. In another conventional semiconductor structure, a conductive via plug is deposited in via 205 prior to forming the second trace 207.

The interconnect structure illustrated in FIG. 2 is referred to as a borderless contact because the first trace 201 does not include an enlarged area (i.e., a 'border') of conductive material where the via 205 is to be formed. That is, the width of the first trace 201 is substantially uniform along its length.

For purposes of comparison, FIG. 3 shows a top view of a semiconductor structure 300 which was commonly used prior to the introduction of borderless contacts. Semiconductor structure 300 includes a first conductive trace 301 having a wide pattern 302 (i.e., a 'border') at the location where the via 303 is to be formed. A second conductive trace 304 extends into the via 303 to contact the first trace 301. The wide pattern 302 provides a larger area for locating the via 303. However, this wide pattern 302 undesirably increases the contacted pitch of the resulting interconnect structure. (The contacted pitch is defined as the minimum center to center spacing between adjacent traces.) Borderless contacts therefore advantageously improve the density of semiconductor structures.

FIG. 4A is a top view of a conventional semiconductor structure 400 which includes both an air gap and a borderless contact. FIG. 4B is a cross sectional view of semiconductor structure 400 along section line 4B—4B of FIG. 4A. As illustrated in FIG. 4B, a pair of electrically conductive traces 401 and 402 are formed over an insulating layer 403 and a semiconductor substrate 404. Traces 401 and 402 are separated by a first distance $X_1$. A dielectric material 405 is formed over traces 401 and 402. A via 406 extends through dielectric material 405 to expose conductive trace 401. An electrically conductive via plug 407 is formed in via 406. The via 406 has an offset $X_2$ with respect to trace 401.

An air gap 408 having a constant width $X_3$ is centered between traces 401 and 402. Air gap 408 is positioned a minimum distance $X_4$ from via 406, thereby preventing via 406 from contacting air gap 408. Via 406 must be separated from air gap 408 to prevent via plug 407 from inadvertently being deposited into air gap 408. If via plug 407 were inadvertently deposited into air gap 408, a relatively large capacitance would exist between traces 401 and 402, thereby resulting in a loss of signal transmission speed on traces 401 and 402. Consequently, it is desirable for distance $X_4$ to be sufficiently large to prevent the via 406 from contacting the air gap 408. However, increasing the distance $X_4$ undesirably increases the contacted pitch between traces 401 and 402. As a result, the density of the semiconductor structure 400 undesirably decreases.

It is also desirable to increase the width $X_3$ of air gap 408, such that the capacitance between traces 401 and 402 is minimized. However, increasing the width of air gap 408 undesirably increases the layout area of the semiconductor structure 400 and/or increases the probability that via 406 will contact air gap 408.

It is also desirable for the allowable offset $X_2$ of via 406 to be as large as possible to improve the density of the borderless contact. However, increasing the offset $X_2$ increases the probability that via 406 will contact air gap 408.

It would therefore be desirable to have a semiconductor structure which combines borderless contact and air gap technologies in a manner which overcomes the previously described deficiencies of the prior art.

SUMMARY

Accordingly, the present invention provides a semiconductor structure having a first trace fabricated adjacent to a second trace over an insulating layer. A dielectric material is located over and between the first and second traces. A borderless contact extends through the dielectric material to contact the first trace. An air gap is located in the dielectric material between the first and second conductive traces, thereby increasing the capacitance between the first and second traces. The air gap has a first portion with a first width adjacent to the borderless contact, and a second portion with a second width at locations away from the borderless contact. The second width is greater than the first width, and the second portion of the air gap is substantially longer than the first portion of the air gap. In addition, the first portion of the air gap is offset toward the second trace.

The second portion of the air gap maximizes the average capacitance between the first and second traces, while the first portion of the air gap minimizes the contacted pitch of the first and second traces. Because the first air gap portion is relatively narrow and offset toward the second trace, additional area is advantageously provided for locating the borderless contact.

In an alternative embodiment of the invention, the first air gap portion is completely filled with dielectric material, thereby eliminating the first air gap portion. In this embodiment, the second air gap portion is still available to insulate the first and second traces along almost the entire length of the traces. This embodiment provides even more area for locating the borderless contact.

The present invention also includes methods for fabricating a semiconductor which includes both a borderless contact and an air gap. One such method includes the steps of (1) forming a first trace and a second trace adjacent to one another over an insulating layer, (2) locating a dielectric material over the first and second traces such that an air gap extends through the dielectric material between the first and second traces, the air gap having a first width along a first portion of the air gap and a second width along a second portion of the air gap, the second width being greater than the first width, and the first portion of the air gap being located closer to the second trace than the first trace, (3) forming a via through the dielectric material to expose the first trace at a location adjacent to the first portion of the air gap, and (4) depositing conductive material in the via.

The air gap is formed in various ways in different embodiments of the invention. In general, the air gap is formed by depositing a first dielectric layer, selectively etching the first dielectric layer, and then depositing a second dielectric layer. The air gap can be formed in the first and/or second dielectric layers.

The present invention will be more fully understood in view of the following description and drawings.

DETAILED DESCRIPTION

Figure 1:
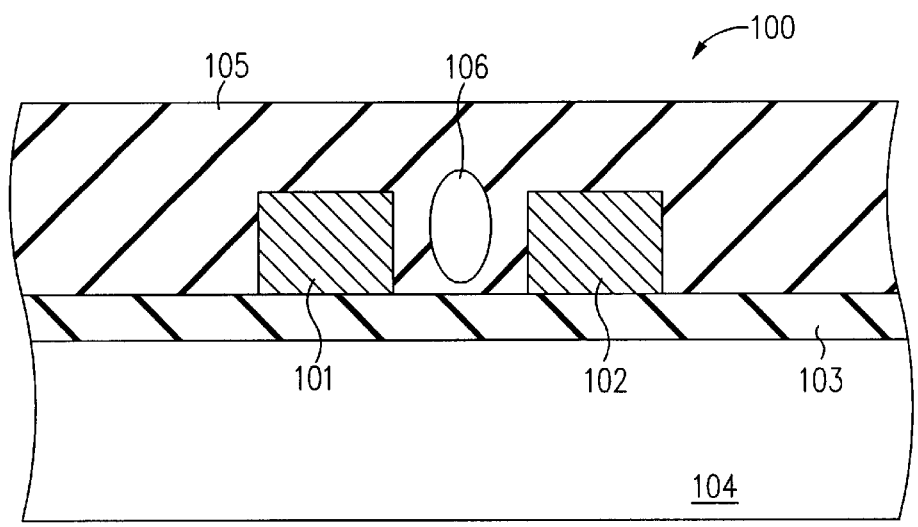
FIG. 1 is a cross sectional view of a semiconductor structure having a conventional air gap.
Figure 2A:
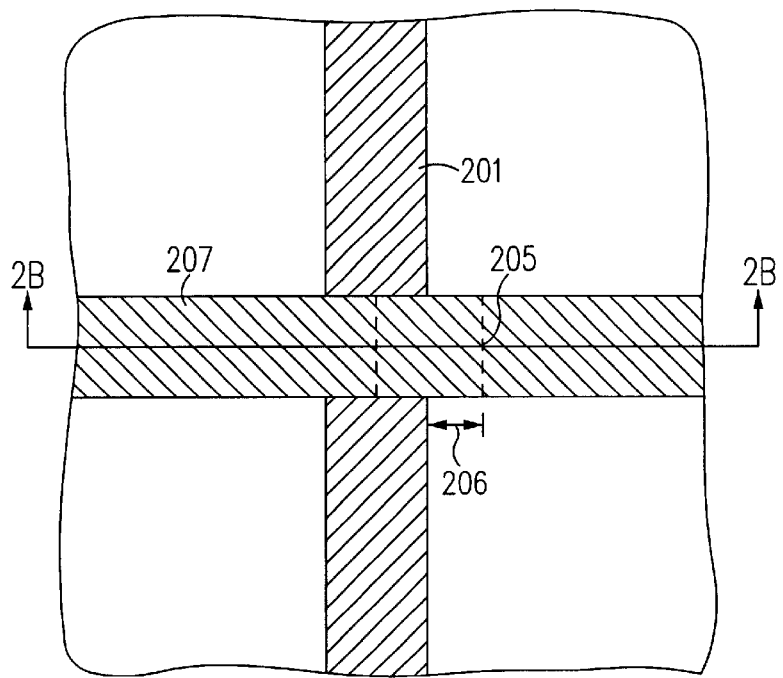
FIGS. 2A and 2B are top and cross sectional views, respectively, of a semiconductor structure having a conventional borderless contact.
Figure 2B:
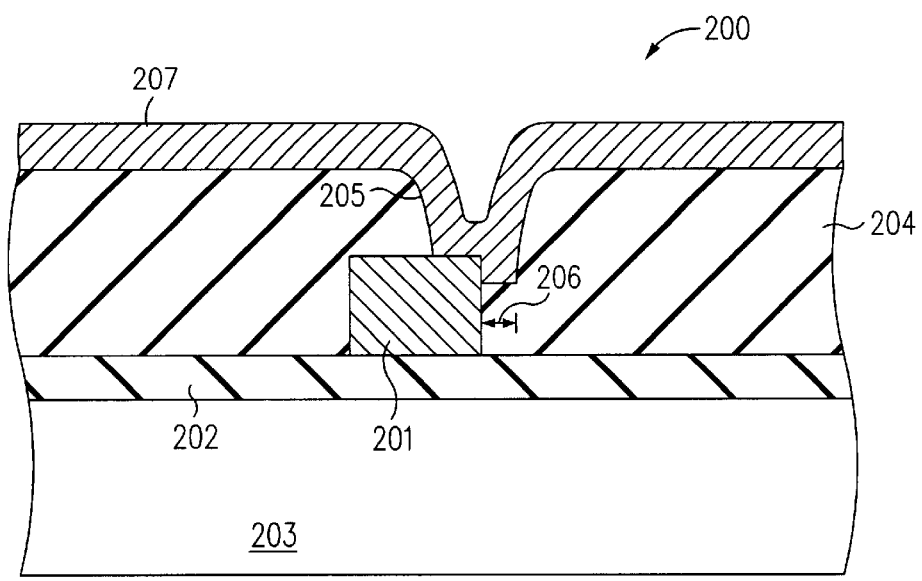
Figure 3:
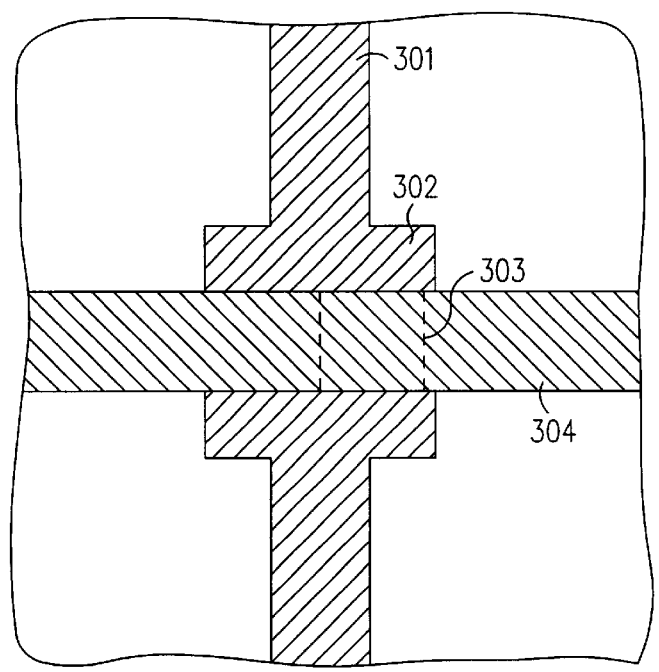
FIG. 3 is a top view of a semiconductor structure having a conventional contact.
Figure 4A:
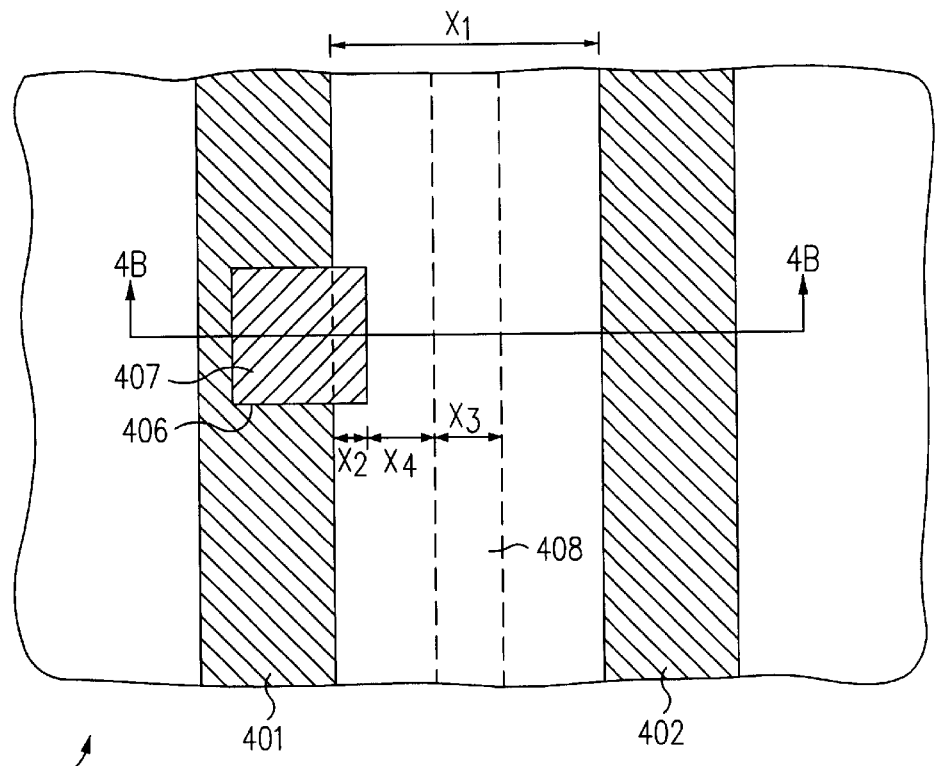
FIGS. 4A and 4B are top and cross sectional views, respectively, of a semiconductor structure having a conventional air gap and borderless contact.
Figure 4B:
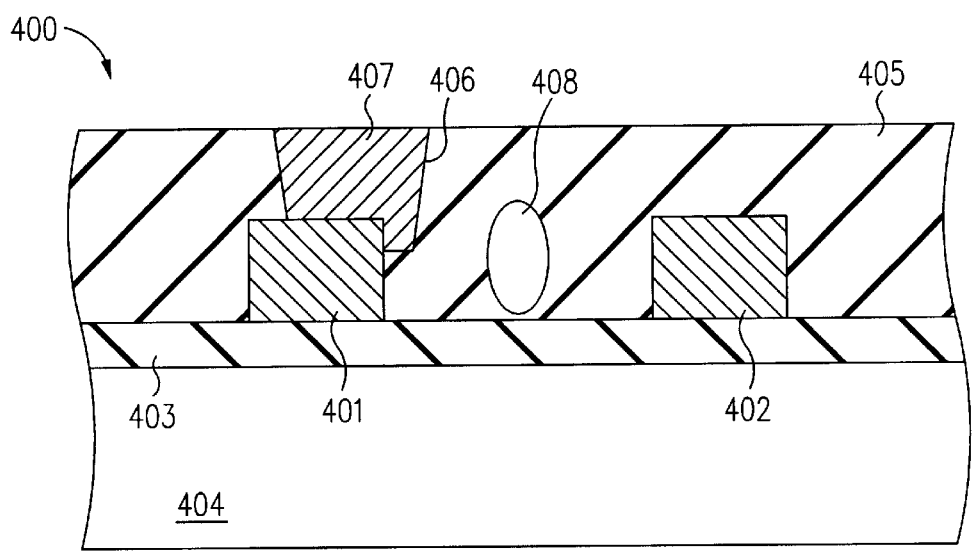
Figure 5A:
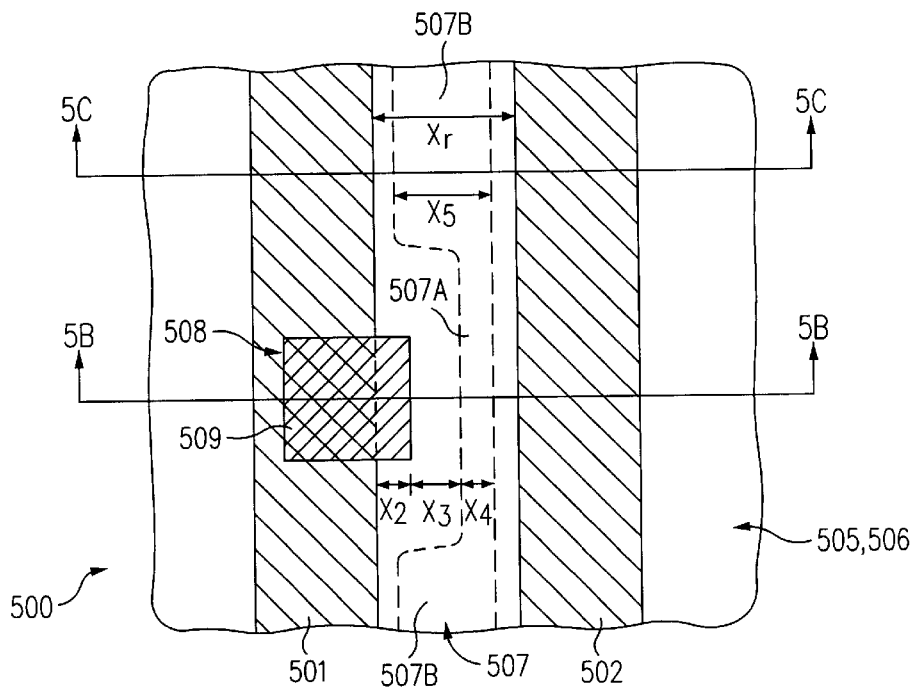
FIG. 5A is a top view of a semiconductor structure having an air gap and borderless contact in accordance with one embodiment of the present invention.
Figure 5B:
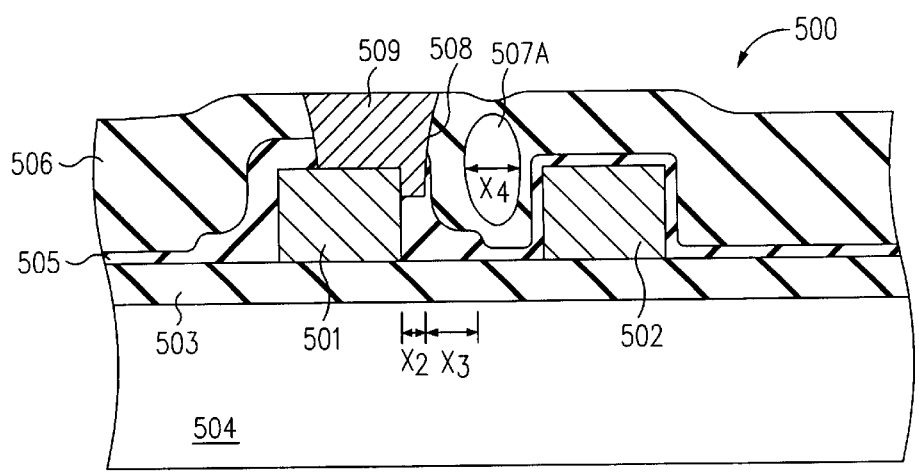
FIG. 5B is a cross sectional view of the semiconductor structure of FIG. 5A, along section line 5B—5B of FIG. 5A.
Figure 5C:
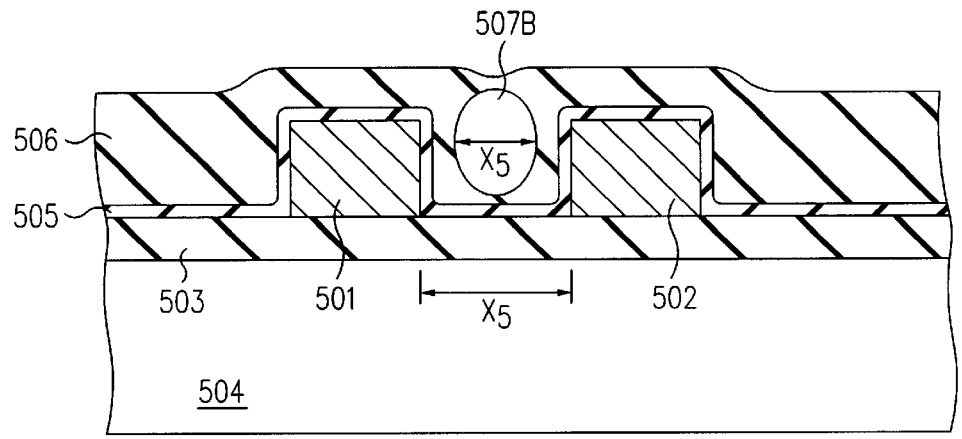
FIG. 5C is a cross sectional view of the semiconductor structure of FIG. 5A, along section line 5C—5C of FIG. 5A.

FIG. 5A is top view of a semiconductor structure 500 having an air gap and a borderless contact in accordance with one embodiment of the present invention. FIG. 5B is a cross sectional view of semiconductor structure 500 along section line 5B—5B of FIG. 5A. FIG. 5C is a cross sectional view of semiconductor structure 500 along section line 5C—5C of FIG. 5A. Semiconductor structure 500 includes a first electrically conductive trace 501 and a second electrically conductive trace 502 formed over an insulating layer 503 and a semiconductor substrate 504. In the described example, insulating layer 503 is silicon oxide, and semiconductor substrate 504 is monocrystalline silicon. However, it is understood that in other embodiments, insulating layer 503 and semiconductor substrate 504 can be made of other materials known to those of ordinary skill in the art. Traces 501 and 502 are made of an electrically conductive material, such as a metal, conductively doped polycrystalline silicon or a metal silicide. In the described example, traces 501 and 502 are separated by a distance $X_1$ of approximately 0.35 microns.

In the described embodiment, traces 501 and 502 are illustrated as being part of a first conductive layer of the semiconductor structure 500. However, the present invention is equally applicable to traces formed in other conductive layers (e.g., the second or third conductive layers).

A first dielectric layer 505 and a second dielectric layer 506 are formed over traces 501 and 502. A via 508, which extends through dielectric layers 505 and 506, exposes a portion of trace 501. Via 508 has an offset $X_2$ with respect to trace 501. In the described example, $X_2$ has a maximum value of approximately 0.12 microns. An electrically conductive via plug 509 is formed in via 508, such that via plug 509 forms a borderless contact with trace 501. In the described embodiment, via 508 has a square shape (when viewed from the top) with dimensions of approximately 0.5 microns by 0.5 microns.

A variable width air gap 507 also extends through dielectric layer 506. Air gap 507 has a first portion 507A adjacent to via plug 509, and a second portion 507B which is spaced away from via plug 509. The first air gap portion 507A is located closer to trace 502 than trace 501. The first air gap portion 507A is separated from via plug 509 by a distance $X_3$. In the described example, the distance $X_3$ is approximately 0.10 microns.

The first air gap portion 507A has a relatively small width $X_4$, and the second air gap portion 507B has a relatively large width $X_5$. In the described example, width $X_4$ is approximately 0.03 microns and width $X_5$ is approximately 0.15 microns. Because the second air gap portion 507B is wider than the first air gap portion 507A, the second air gap portion 507B provides greater insulation between traces 501 and 502 than the first air gap portion 507A. However, the second air gap portion 507B is much longer than the first air gap portion 507A. For example, the length of the first air gap portion 507A typically represents less than 1 percent of the length of air gap portion 507B. In the described example, the length of the first air gap portion 507A is on the order of 0.7 microns. Thus, the average capacitance between traces 501 and 502 is largely determined by the dimensions of the second air gap portion 507B.

Variable width air gap 507 has the following advantages. First, the volume of the air gap 507 is maximized along a major portion of the air gap (i.e., along the second air gap portion 507B), thereby advantageously reducing the capacitance between traces 501 and 502. In addition, the positioning of the first air gap portion 507A, along with the relatively small width $X_4$ of the first air gap portion 507A, ensures that via plug 509 is not deposited into the first air gap portion 507A. Furthermore, the positioning and width of the first air gap portion 507A advantageously allows the formation of a borderless contact/air gap structure which does not increase the contacted pitch between traces 501 and 502. In addition, the offset $X_2$ between trace 501 and via 508 is maximized with respect to the distance between trace 501 and trace 502.

Figure 6A:
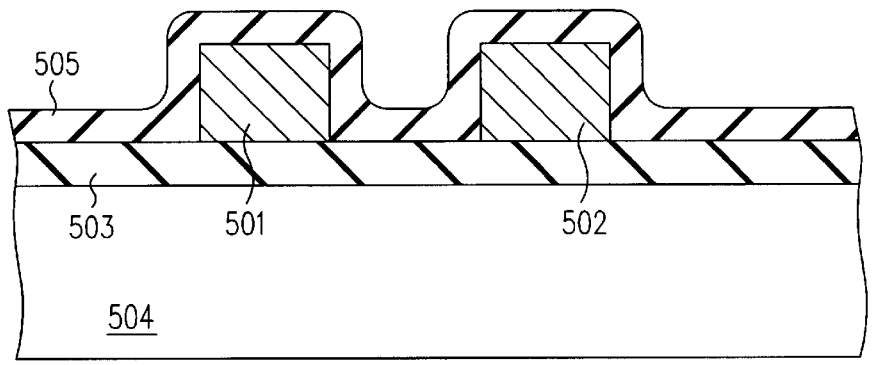
FIGS. 6A, 6B and 6C are cross sectional views along section line 5B—5B of the semiconductor structure of FIG. 5A during various processing steps.
Figure 6B:
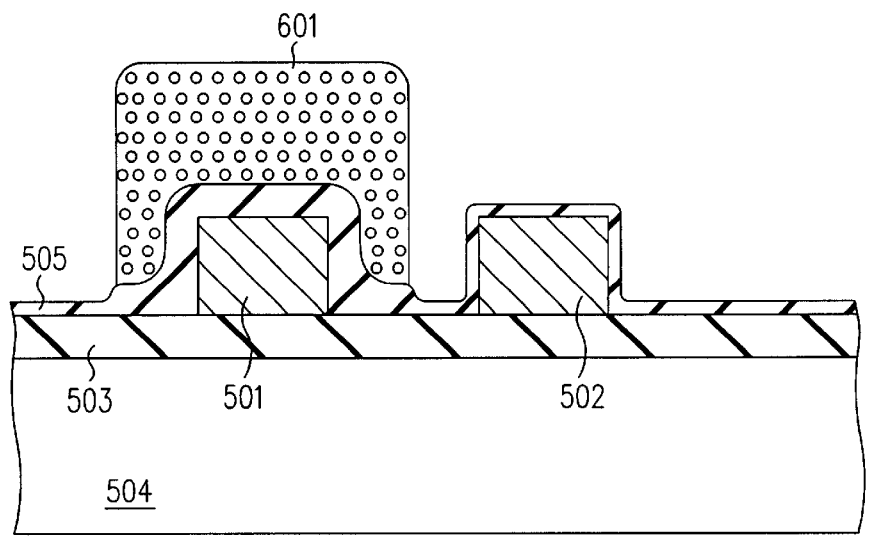
Figure 6C:
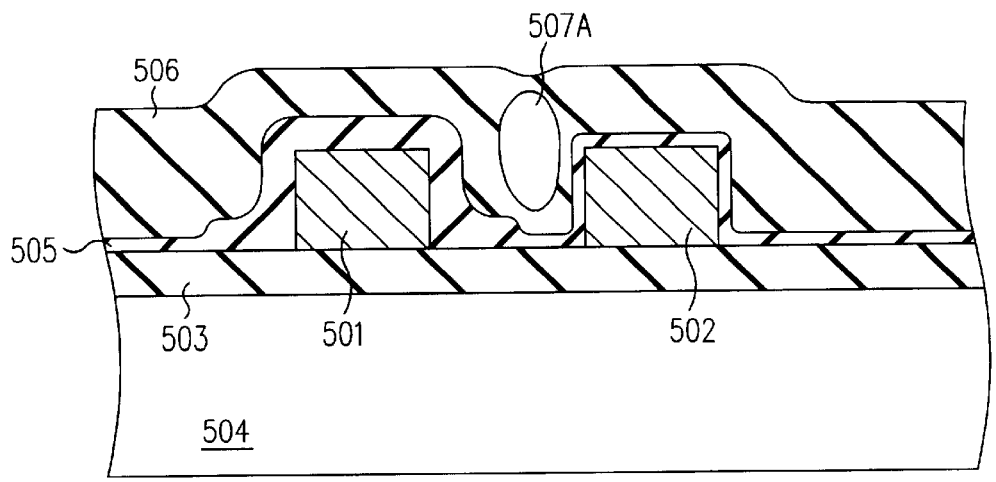
Figure 7:
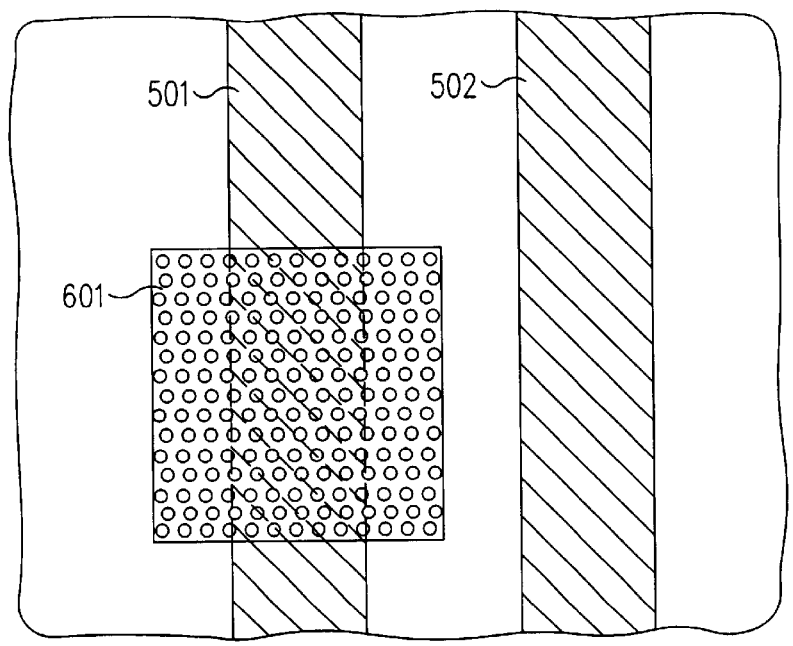
FIG. 7 is a top view of the semiconductor structure illustrated in FIG. 6B.

FIGS. 6A, 6B and 6C are cross sectional views along section line 5B—5B of semiconductor structure 500 during various processing steps. FIG. 7 is a top view of semiconductor structure 500 during the processing step illustrated in FIG. 6B.

Turning now to FIG. 6A, insulating layer 503 is formed over the upper surface of semiconductor substrate 504 in a manner known to those of ordinary skill in the art. Insulating layer 503 can be formed by conventional semiconductor processing techniques, including thermal oxidation or chemical vapor deposition (CVD). Semiconductor devices (not shown), such as transistors, resistors and diodes, are typically formed in substrate 504.

Traces 501 and 502 are formed over insulating layer 503 in accordance with conventional processing techniques. For example, a metal layer can be formed over the entire upper surface of insulating layer 503. This metal layer can then be patterned to form traces 501 and 502. Traces 501 and 502 typically extend through insulating layer 503 to form connections to semiconductor devices fabricated in substrate 504. As previously described, traces 501 and 502 are separated by a distance $X_1$ of 0.35 microns. Traces 501 and 502 typically have thicknesses in the range of 0.6 microns and widths in the range of 0.35 microns.

A first dielectric layer 505 is deposited over the resulting structure. In the described example, dielectric layer 505 is BPSG having a thickness of approximately 6000 Å, however, other thicknesses are possible and are considered within the scope of the invention. Other dielectric materials, such as undoped CVD oxide, can be used to form dielectric layer 505 in other embodiments.

Turning now to FIG. 6B and FIG. 7, a layer of photo-resist is deposited, exposed and developed to form photo-resist mask 601. Photo-resist mask 601 is located in the general area where via 508 will subsequently be formed. In the described example, photo-resist mask 601 has a generally square shape and is centered over trace 501. When viewed from the top (FIG. 7), photo-resist mask 601 has dimensions of approximately 0.6 microns by 0.6 microns. As will become apparent in view of the subsequent discussion, photo-resist mask 601 defines the location of the first air gap portion 507A. After photo-resist mask 601 has been formed, a controlled etch is performed, thereby thinning the exposed portions of dielectric layer 505 (i.e., those portions of dielectric layer 505 which are not covered by photo-resist mask 601). In one embodiment, this etch is a timed etch which is performed using $CF_4/CHF_3$ as the etchant. In the described example, the etch is performed until the exposed portions of dielectric layer 505 have a thickness of approximately 0.10 microns. FIG. 6B illustrates the results of the controlled etch.

Photo-resist mask 601 is then stripped, and the second dielectric layer 506 is deposited over the resulting structure as illustrated in FIG. 6C. In the described example, the second dielectric layer 506 is BPSG having a thickness of approximately 1.3 microns with subsequent chemical-mechanical planarization (CMP). In other embodiments, the second dielectric layer 506 can be formed from other dielectric materials, such as undoped CVD oxide. The topography of the first dielectric layer 505 between traces 501 and 502 causes the first air gap portion 507A to be formed within the second dielectric layer 506 as illustrated. Due to the topography of the first dielectric layer 505, the first air gap portion 507A is located closer to trace 502 than trace 501. Thus, the first air gap portion 507A differs from the second air gap portion 507B (FIG. 5C), which is formed in a substantially symmetric manner between traces 501 and 502.

Via 508 is then etched through dielectric layers 505 and 506 to expose trace 501. Via 508 is roughly centered within the area previously occupied by photo-resist mask 601. That is, via 508 is roughly centered along the length of the first air gap portion 507A. As previously described, via 508 has a generally square shape with dimensions of 0.5 microns by 0.5 microns. A conductive material, such as tungsten, is then deposited in via 508 to form via plug 509 (See, FIG. 5B).

Figure 8:
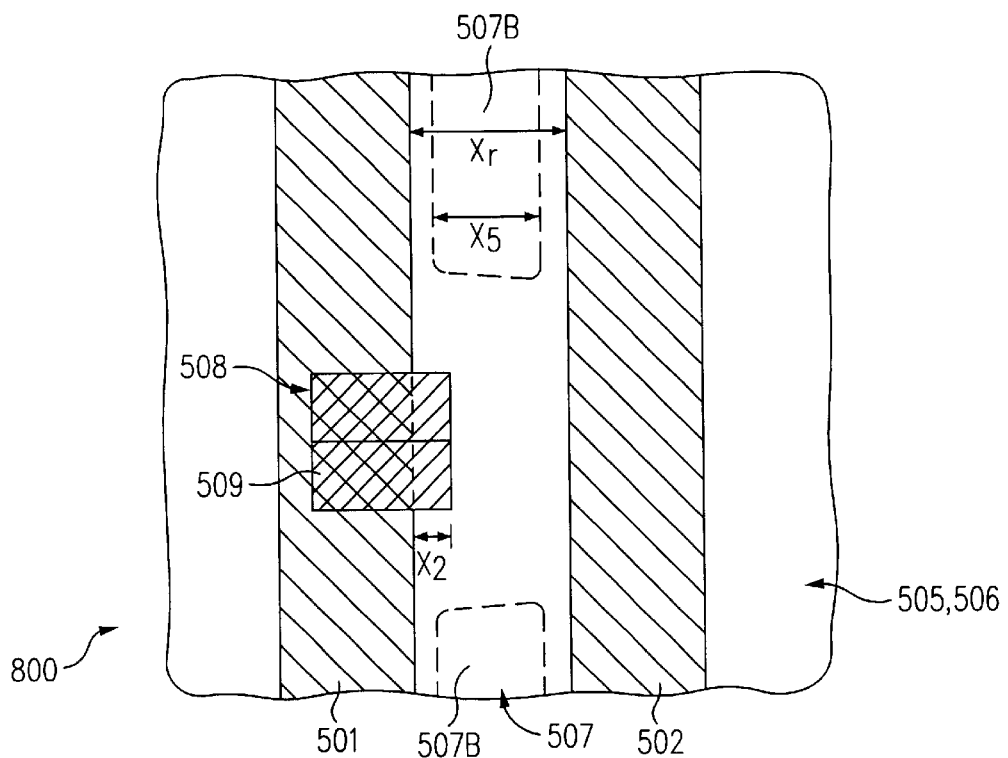
FIG. 8 is a top view of a semiconductor structure in accordance with an alternative embodiment of the present invention.

FIG. 8 is a top view of a semiconductor structure 800 in accordance with an alternative embodiment of the present invention. Because semiconductor structure 800 is similar to semiconductor structure 500 (FIGS. 5A–5C), similar elements in FIGS. 5A–5C and FIG. 8 are labeled with similar reference numbers. The main difference between semiconductor structure 800 and semiconductor structure 500 is that semiconductor structure 800 does not include the first air gap portion 507A of semiconductor structure 500. Semiconductor structure 800 may result if the second dielectric layer 506 fills the first air gap portion 507A during fabrication of semiconductor structure 500.

Semiconductor structure 800 exhibits many of the advantages of semiconductor structure 500. However, the absence of the first air gap portion 507A in semiconductor structure 800 may result in a slightly higher capacitance between traces 501 and 502. On the other hand, the absence of the first air gap portion 507A in semiconductor structure 800 allows for a larger maximum offset $X_2$ between trace 501 and via 508 (because there is no first air gap portion into which via plug 509 can be inadvertently deposited).

Figure 9A:
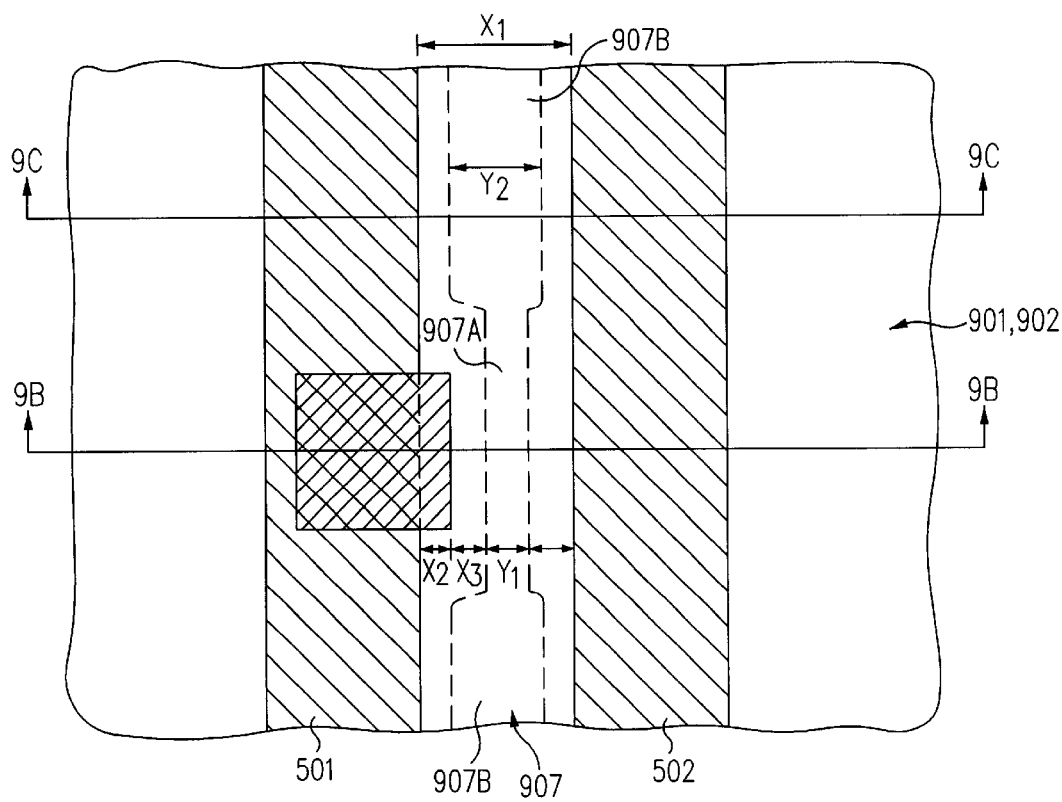
FIG. 9A is a top view of a semiconductor structure in accordance with another embodiment of the present invention.
Figure 9B:
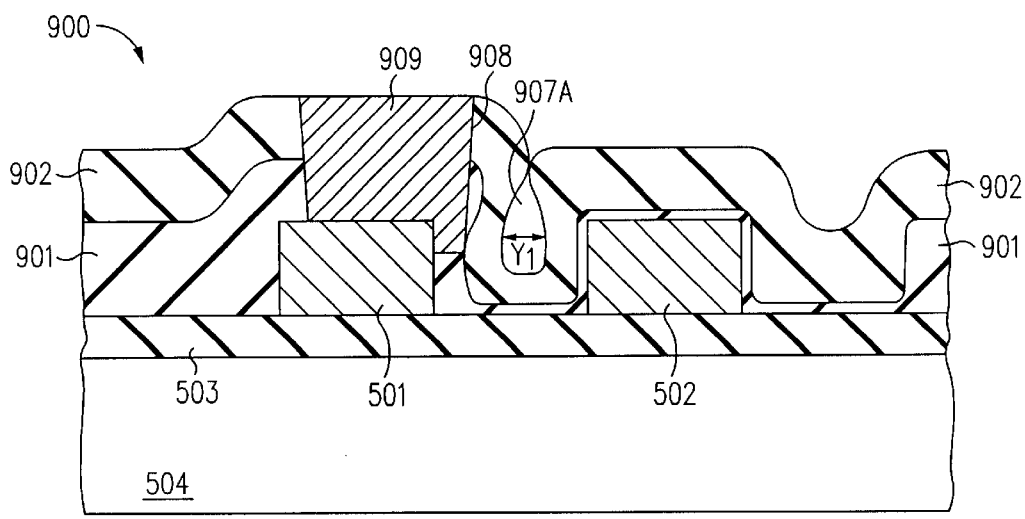
FIG. 9B is a cross sectional view of the semiconductor structure of FIG. 9A along section line 9B—9B of FIG. 9A.
Figure 9C:
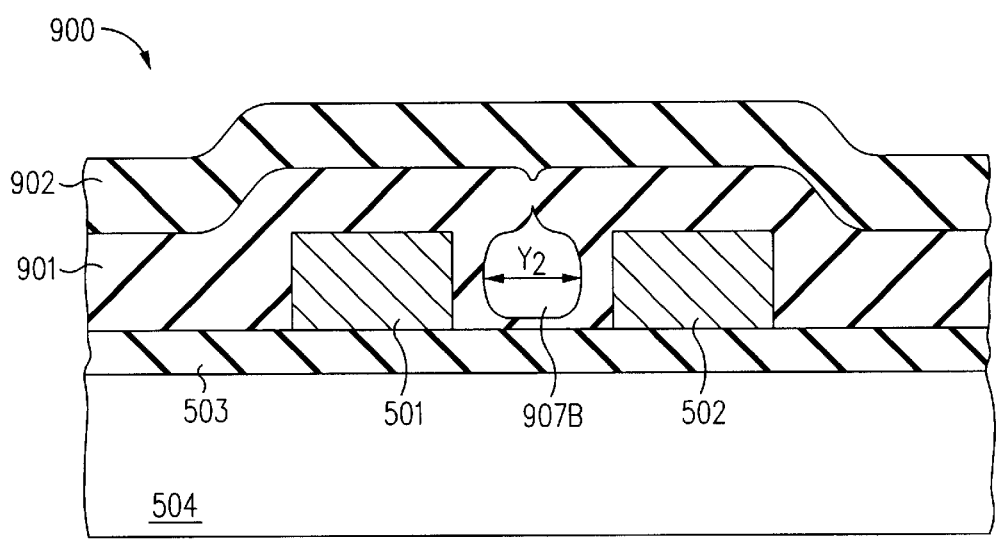
FIG. 9C is a cross sectional view of the semiconductor structure of FIG. 9A along section line 9C—9C of FIG. 9A.

FIG. 9A is a top view of a semiconductor structure 900 in accordance with another embodiment of the present invention. FIG. 9B is a cross sectional view of semiconductor structure 900 along section line 9B—9B of FIG. 9A. FIG. 9C is a cross sectional view of semiconductor structure 900 along section line 9C—9C of FIG. 9A. Because semiconductor structure 900 is similar to semiconductor structure 500 (FIGS. 5A–5C), similar elements in FIGS. 5A–5C and FIGS. 9A–9C are labeled with similar reference numbers. Thus, semiconductor structure 900 includes traces 501–502, insulating layer 503 and semiconductor substrate 504 as previously described.

In addition, semiconductor structure 900 includes a first dielectric layer 901 and a second dielectric layer 902 located over traces 501–502 and insulating layer 503. A via 908 extends through the first and second dielectric layers 901 and 902 to expose trace 501. A conductive via plug 909 is located in via 908, thereby providing an electrical connection to trace 501. As described in more detail below, the first dielectric layer 901 has a reduced thickness over trace 502 in the area adjacent to via plug 908.

A variable width air gap 907 is located between traces 501 and 502 as illustrated. Air gap 907 has a first portion 907A adjacent to via plug 909, and a second portion 907B which is spaced away from via plug 909. The first air gap portion 907A is narrower than the second air gap portion 907B, and is offset toward trace 502. In the described embodiment, the first air gap portion 907A has a width $Y_1$ of approximately 0.03 microns, and the second air gap portion 907B has a width $Y_2$ of approximately 0.15 microns. Air gap 907 exhibits the same advantages previously described for air gap 507. For reasons which will become apparent in view of the subsequent disclosure, both of the outer edges of the air gap 907 become narrower as the air gap transitions from the second portion 907B to the first portion 907A. (See, FIG. 9A.)

Figure 10A:
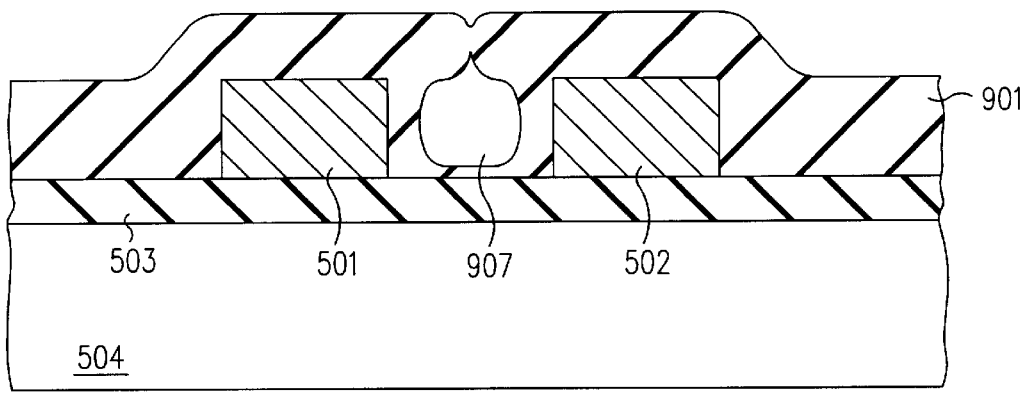
FIGS. 10A, 10B and 10C are cross sectional views along section line 9B—9B of the semiconductor structure of FIG. 9A during various processing steps.
Figure 11A:
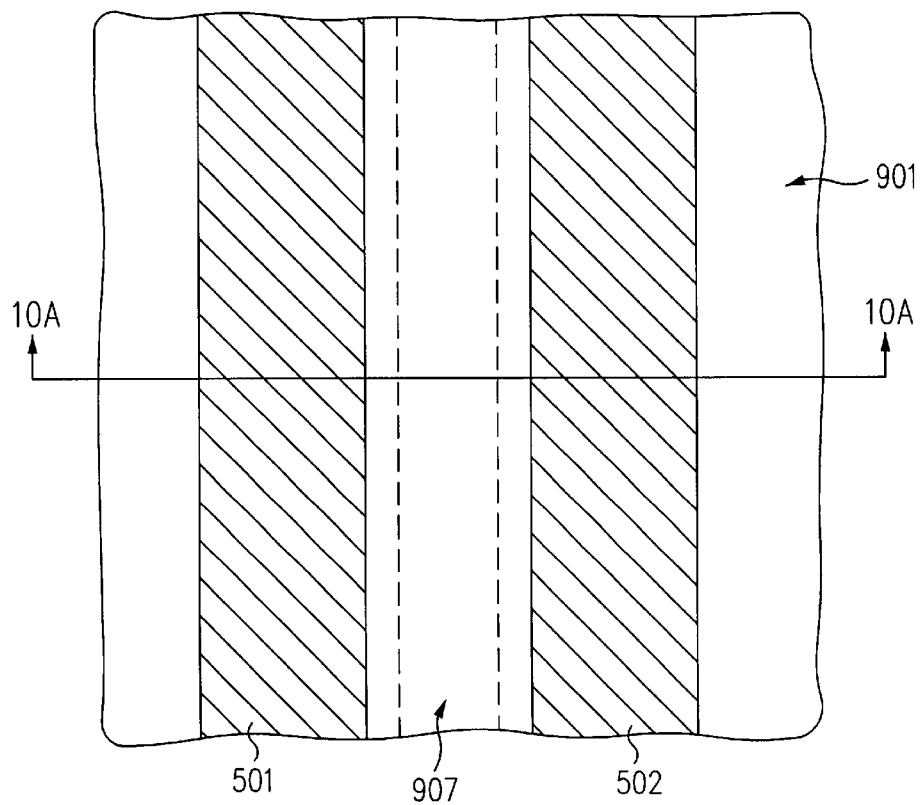
FIGS. 11A, 11B and 11C are top views of the semiconductor structures illustrated in FIGS. 10A, 10B and 10C, respectively.
Figure 10B:
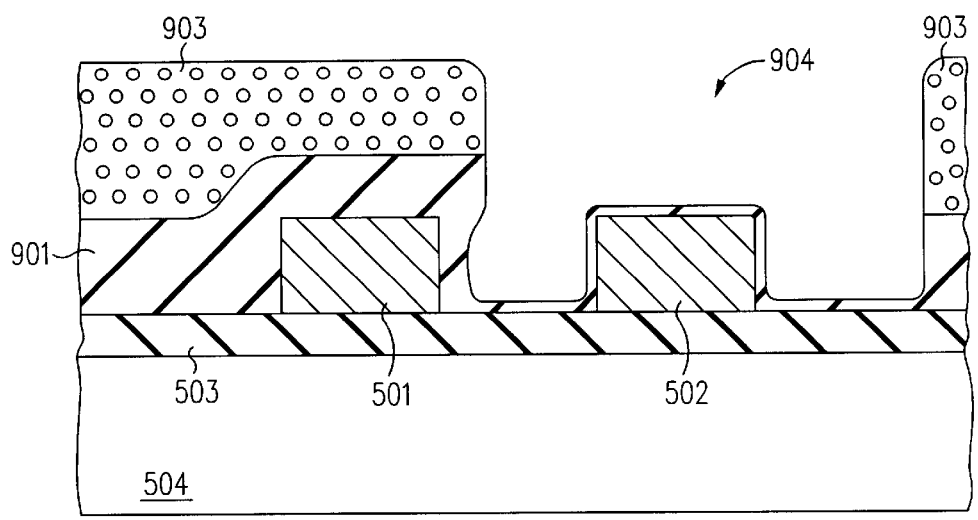
Figure 11B:
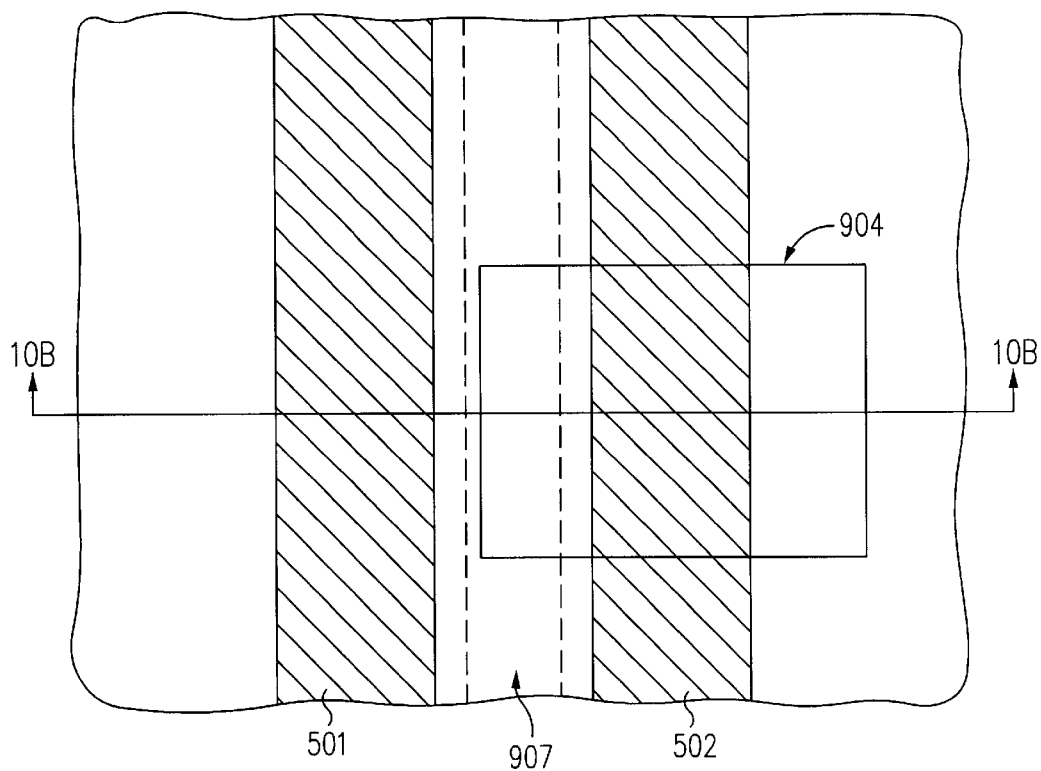
Figure 10C:
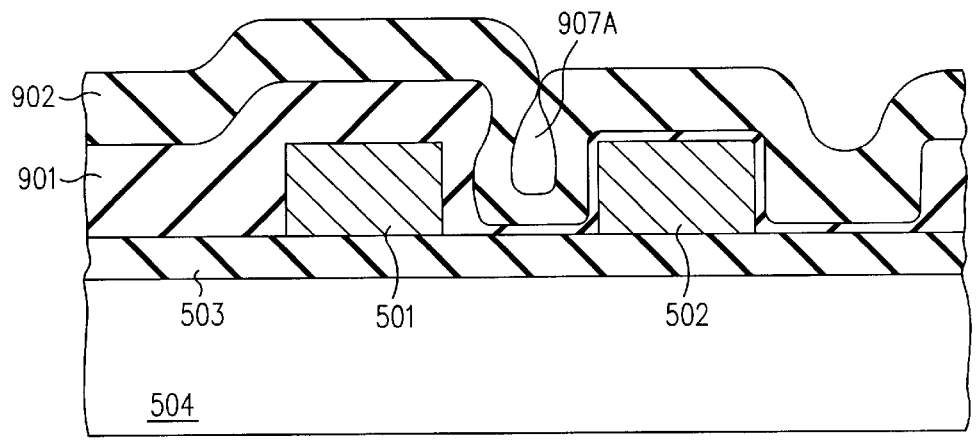
Figure 11C:
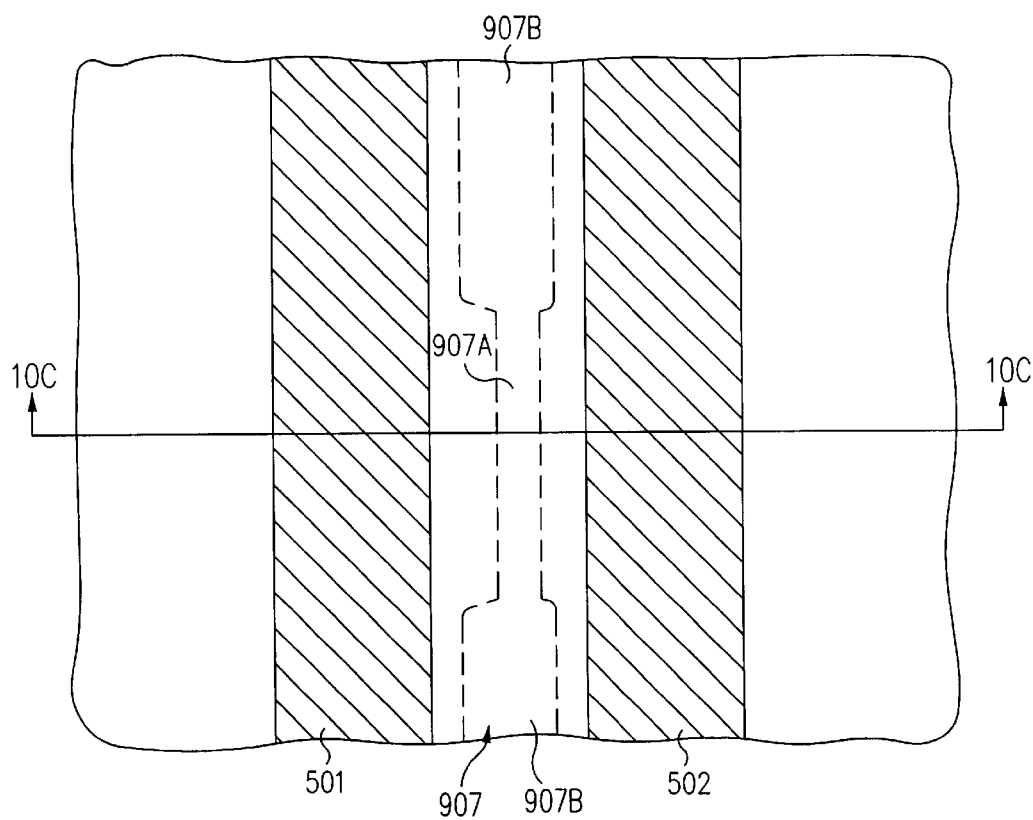

FIGS. 10A, 10B and 10C are cross sectional views along section line 9B—9B of semiconductor structure 900 during various processing steps. FIGS. 11A, 11B and 11C are top views of semiconductor structure 900 during the processing steps illustrated in FIGS. 10A, 10B and 10C, respectively.

Turning now to FIG. 10A, the first dielectric layer 901 is deposited over traces 501 and 502, thereby forming a conventional air gap 907 between traces 501 and 502. As illustrated in FIG. 11A, at this time, the air gap 907 has a constant width and is centered between traces 501 and 502. In the described embodiment, the first dielectric layer 901 is BPSG, deposited to a thickness of 6000 Angstroms.

As illustrated in FIG. 10B, a photo-resist mask 903, having an opening 904, is then formed over the upper surface of the first dielectric layer 901. FIG. 11B illustrates the boundary of opening 904. Opening 904 exposes a portion of trace 502, as well as an area between traces 501 and 502. In the described embodiment, the left-most edge of opening 904 extends partially across the distance $X_1$ between traces 501 and 502. Opening 904 is located adjacent to the area where via 908 is subsequently formed.

After photo-resist mask 903 has been formed, a controlled etch is performed, thereby thinning the area of the first dielectric layer 901 which is exposed by opening 904. In one embodiment, this etch is a timed etch which is performed using $CF_4/CHF_3$ as the etchant. In the described example, the etch is performed until the exposed area of the first dielectric layer 901 has a thickness of approximately 0.10 microns. The results of the controlled etch are illustrated in FIG. 10B.

Photo-resist mask 903 is then stripped, and the second dielectric layer 901 is deposited over the resulting structure as illustrated in FIG. 10C. In the described example, the second dielectric layer 902 is BPSG having a thickness of approximately 1.3 microns with subsequent CMP planarization. In other embodiments, the second dielectric layer 902 can be formed from other dielectric materials and have other thicknesses. The topography of the first dielectric layer 901 between traces 501 and 502 causes the first air gap portion 907A to be formed within the second dielectric layer 902 as illustrated. Due to the topography of the first dielectric layer 901, the first air gap portion 907A is located closer to trace 502 than trace 501.

The portion of the air gap 907 which was not previously exposed by opening 904 of photo-resist mask 903 (i.e., the second air gap portion 907B) was not disturbed by the controlled etch. As a result, the second dielectric layer 902 is deposited over the top of the non-etched portions of the first dielectric layer 901, and does not disturb the original air gap 907. FIG. 9C illustrates this point.

Via 908 is then etched through the first and second dielectric layers 901 and 902 to expose trace 501 (FIG. 9B). Via 908 is roughly centered along the length of the first air gap portion 907A. Via 908 has a generally square shape with dimensions of approximately 0.5 microns by 0.5 microns. A conductive material, such as tungsten, is deposited in via 908 to form via plug 909 (See, FIG. 9B).

In an alternative embodiment of the present invention, the first air gap portion 907A of semiconductor structure 900 is eliminated by controlling the fabrication of the second dielectric layer 902 such that the second dielectric layer 902 does not include a first air gap portion 907A. This alternative embodiment retains many of the advantages of semiconductor structure 900. However, the absence of the first air gap portion 907A may result in a slightly higher capacitance between traces 501 and 502. On the other hand, the absence of the first air gap portion 907A would allow for a larger maximum offset $X_2$ between trace 501 and via 908.

Although the present invention has been described in connection with several embodiments, it is understood that this invention is not limited to the embodiments disclosed, but is capable of various modifications which would be apparent to one of ordinary skill in the art. Thus, the invention is limited only by the following claims.

We claim:

1. A semiconductor structure comprising:
   a first conductive trace;
   a second conductive trace located adjacent to the first conductive trace;
   dielectric material located over and between the first and second conductive traces;
   a borderless contact which extends through the dielectric material to contact the first conductive trace; and
   an air gap located in the dielectric material between the first and second conductive traces, the air gap having a first portion having a first width adjacent to the borderless contact, and a second portion having a second width at locations away from the borderless contact, wherein the second width is greater than the first width.

2. The semiconductor structure of claim 1, wherein the first portion of the air gap is offset toward the second conductive trace.

3. The semiconductor structure of claim 1, further comprising:
   a semiconductor substrate; and
   an insulating layer formed over the semiconductor substrate, wherein the first and second conductive traces are formed over the insulating layer.

4. The semiconductor structure of claim 1, wherein the dielectric material comprises:
   a first dielectric layer located over the first and second conductive traces, the first dielectric layer having an increased thickness over a portion of the first conductive trace where the borderless contact is located; and
   a second dielectric layer located over the first dielectric layer, wherein the air gap is located in the second dielectric layer.

5. The semiconductor structure of claim 1, wherein the dielectric material comprises:
   a first dielectric layer located over the first and second conductive traces, the first dielectric layer having an reduced thickness over a portion of the second conductive trace, adjacent to where the borderless contact is located; and
   a second dielectric layer located over the first dielectric layer, wherein the first portion of the air gap is located in the second dielectric layer and the second portion of the air gap is located in the first dielectric layer.

6. The semiconductor structure of claim 1, wherein the dielectric material comprises glass.

7. A semiconductor structure comprising:

a first conductive trace;

a second conductive trace located adjacent to the first conductive trace;

a dielectric material located over and between the first and second conductive traces;

a borderless contact which extends through the dielectric material to contact the first conductive trace; and an air gap located in the dielectric material between the first and second conductive traces, wherein the air gap is not present between the first and second traces adjacent to the borderless contact.

8. The semiconductor structure of claim 7, wherein the dielectric material comprises:

a first dielectric layer located over and between the first and second conductive traces; and a second dielectric layer located over the first dielectric layer, wherein the air gap is located in the second dielectric layer.

9. The semiconductor structure of claim 7, wherein the dielectric material comprises:

a first dielectric layer located over and between the first and second conductive traces, wherein the air gap is located in the first dielectric layer; and a second dielectric layer located over the first dielectric layer.

10. The semiconductor structure of claim 7, wherein the dielectric material comprises glass.

* * * * *